United States Patent
Nakano

(10) Patent No.: US 7,207,837 B2
(45) Date of Patent: Apr. 24, 2007

(54) CONNECTOR AND A MOUNTING METHOD THEREFOR

(75) Inventor: Hiroshi Nakano, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 11/504,176

(22) Filed: Aug. 15, 2006

(65) Prior Publication Data

US 2007/0054548 A1 Mar. 8, 2007

(30) Foreign Application Priority Data

Aug. 22, 2005 (JP) ............................. 2005-240159

(51) Int. Cl.
*H01R 13/70* (2006.01)

(52) U.S. Cl. ................................... 439/570

(58) Field of Classification Search ............... 439/570, 439/571, 64

See application file for complete search history.

(56) References Cited

U.S. PATENT DOCUMENTS

| 5,270,492 | A | | 12/1993 | Fukui | |
|---|---|---|---|---|---|
| 5,357,074 | A | * | 10/1994 | Pawlikowski | ............ 219/85.18 |
| 5,395,265 | A | * | 3/1995 | DiMondi et al. | ........... 439/553 |
| 5,704,807 | A | * | 1/1998 | Sherman et al. | ............ 439/570 |
| 6,012,949 | A | * | 1/2000 | Lok | ............................. 439/570 |
| 6,227,906 | B1 | * | 5/2001 | Fan | ............................... 439/570 |
| 6,254,429 | B1 | * | 7/2001 | Morita | ........................ 439/570 |
| 6,287,130 | B1 | | 9/2001 | Torii | |
| 6,461,188 | B2 | * | 10/2002 | Reul | ........................... 439/422 |
| 6,517,378 | B2 | * | 2/2003 | Fumikura | .................... 439/570 |
| 7,074,079 | B2 | * | 7/2006 | Higuchi | ...................... 439/566 |
| 7,094,100 | B2 | * | 8/2006 | Nakano | ....................... 439/570 |
| 7,121,880 | B2 | * | 10/2006 | Sasaki et al. | ................ 439/566 |

FOREIGN PATENT DOCUMENTS

| JP | 01006385 | 1/1989 |
|---|---|---|
| JP | 2003-17164 | 1/2003 |

* cited by examiner

*Primary Examiner*—Phuong Dinh
(74) *Attorney, Agent, or Firm*—Gerald E. Hespos; Anthony J. Casella

(57) ABSTRACT

A circuit board connector (1) has a housing (10), male terminals (20) and fixing members (30). Each fixing member (30) is formed by bending a metal plate into an L-shape to define a mounting portion (31) to mount the fixing member (30) to the housing (10), and a bonding portion (32) to be soldered. The bonding portion (32) is formed with connecting pieces (33) by making U-shaped cuts through the bonding portion (32) and then bending areas enclosed by the cuts upward. A clearance (S) is defined between the bottom edge of the leading end of each connecting piece (33) and the corresponding through hole (34). The lower surfaces of the connecting pieces (33) and the inner surfaces of the through holes (34) can be soldered.

17 Claims, 4 Drawing Sheets

CONNECTOR AND A MOUNTING METHOD THEREFOR

BACKGROUND OF THE INVENTION

1. Field of the Invention

The invention relates to connector for an electric or electronic device, in particular a circuit board connector, and to a method of mounting the connector on the electric or electronic device.

2. Description of the Related Art

Japanese Unexamined Patent Publication No. 2003-17164 is directed to a connector to be mounted on a circuit board by reflow soldering. L-shaped fixing members are provided at the opposite sides of the connector, and are soldered to the circuit board to be fixed by the reflow soldering.

The fixing strength of the soldered connection between the fixing members and the circuit board can be reduced by bubbles created by the reflow soldering. Through holes can be formed in the fixing members to let bubbles escape. However, the through holes reduce a bonding area to the circuit board and reduce bonding strength to the circuit board.

The present invention was developed in view of the above problem, and an object thereof is to restrain a reduction in bonding strength to a circuit board while suppressing or reducing the production of bubbles.

SUMMARY OF THE INVENTION

The invention relates to a connector for an electric or electronic device, such as a circuit board. The connector has a housing with at least one fixing member to be fixed to the device. The fixing member has at least one bonding portion to be bonded to solder. The bonding portion is formed with at least one through hole and with at least one connecting piece that at least partly covers the through hole at a surface substantially opposite a connecting surface with the solder. The connecting piece bonds to the solder and defines a clearance that communicates with the through hole. Thus, bubbles created in the solder can escape through the through hole and through the clearance between the connecting piece and the bonding portion. Accordingly, bonding strength to the circuit board is not reduced significantly.

The fixing member preferably is to be fixed to the electric or electronic device by reflow soldering.

The connecting piece preferably is formed by cutting a part of the bonding portion and bending the cut part. Accordingly, the connecting piece can be formed more easily as compared to a case where a connecting piece is prepared separately and attached to the bonding portion later.

The connecting piece preferably is formed by making a substantially gate-shaped or U-shaped slit with an opening faced towards a mounting portion of the fixing member.

The bonding portion preferably is formed with slits at positions spaced apart in a width direction to form two or more projections. Each projection can be soldered to the electric or electronic device.

The housing preferably has a mounting surface to be brought into sliding contact with a mounting portion of the fixing member. The mounting surfaces preferably are recessed inward by substantially the width of the bonding portions. Thus, opposite side surfaces of the housing and the outer edges of the bonding portions are substantially flush with each other when the fixing members are mounted in the mounting portions.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
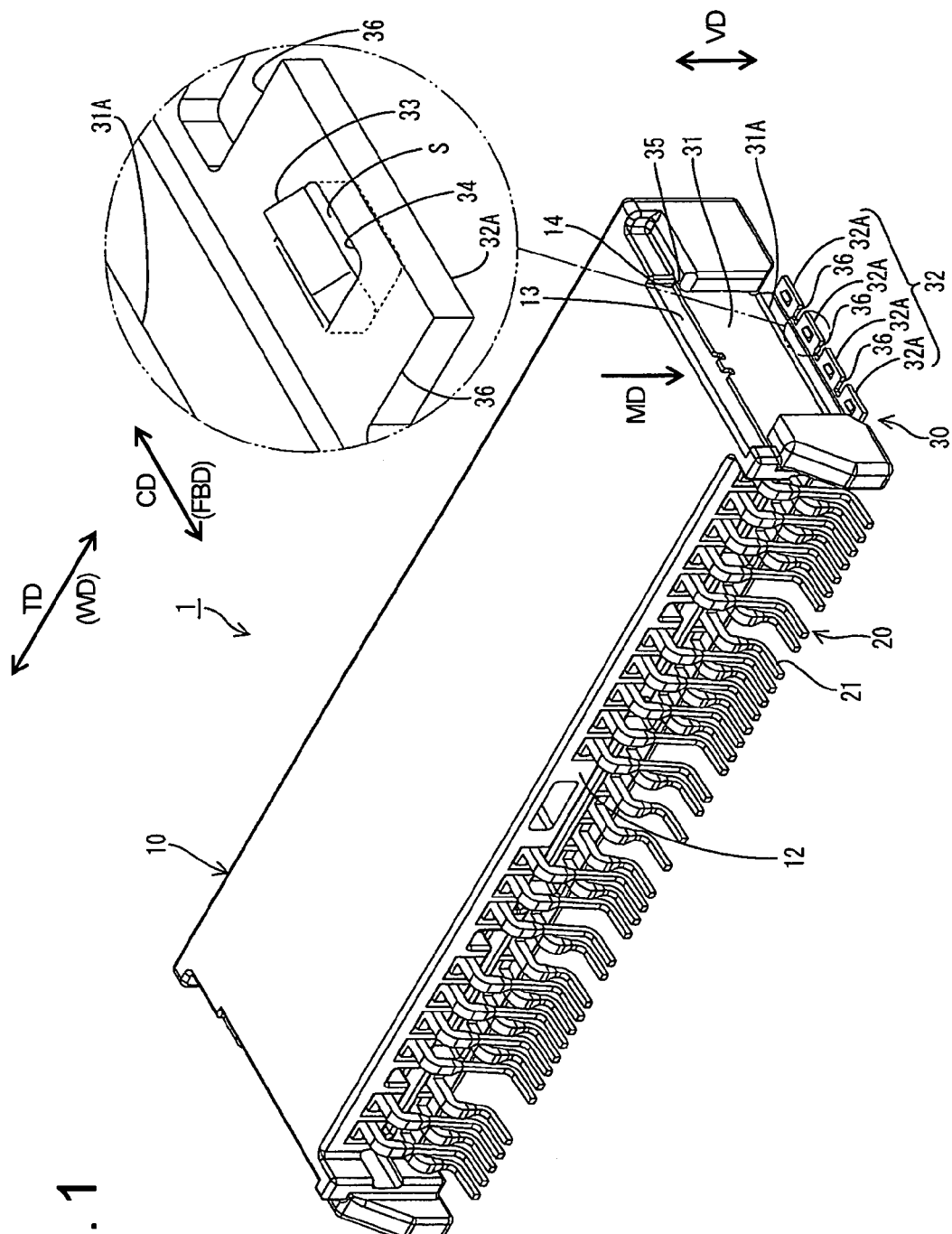
FIG. 1 is a perspective view of a connector according to the invention.
Figure 2:
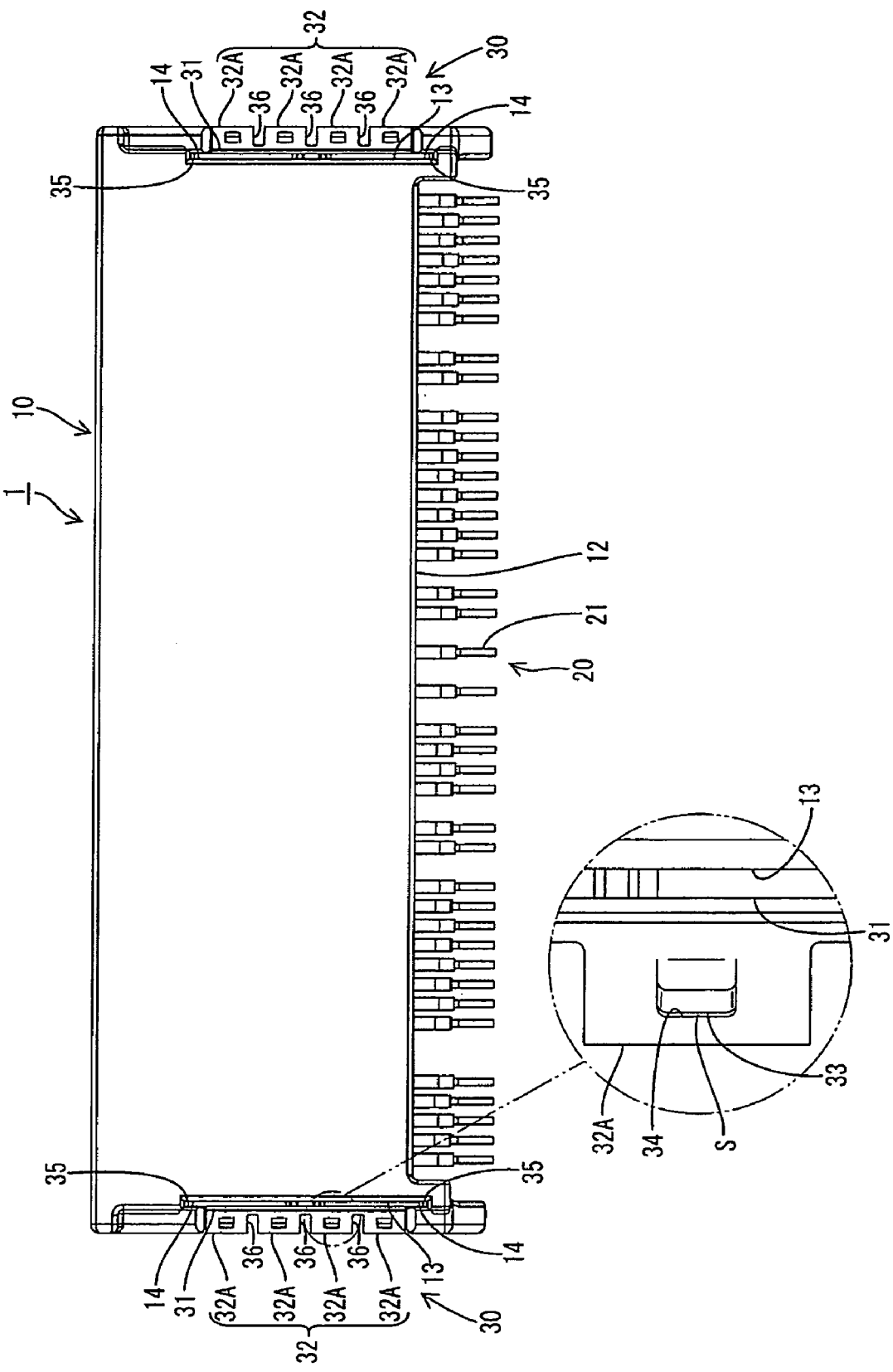
FIG. 2 is a plan view of the connector.
Figure 3:
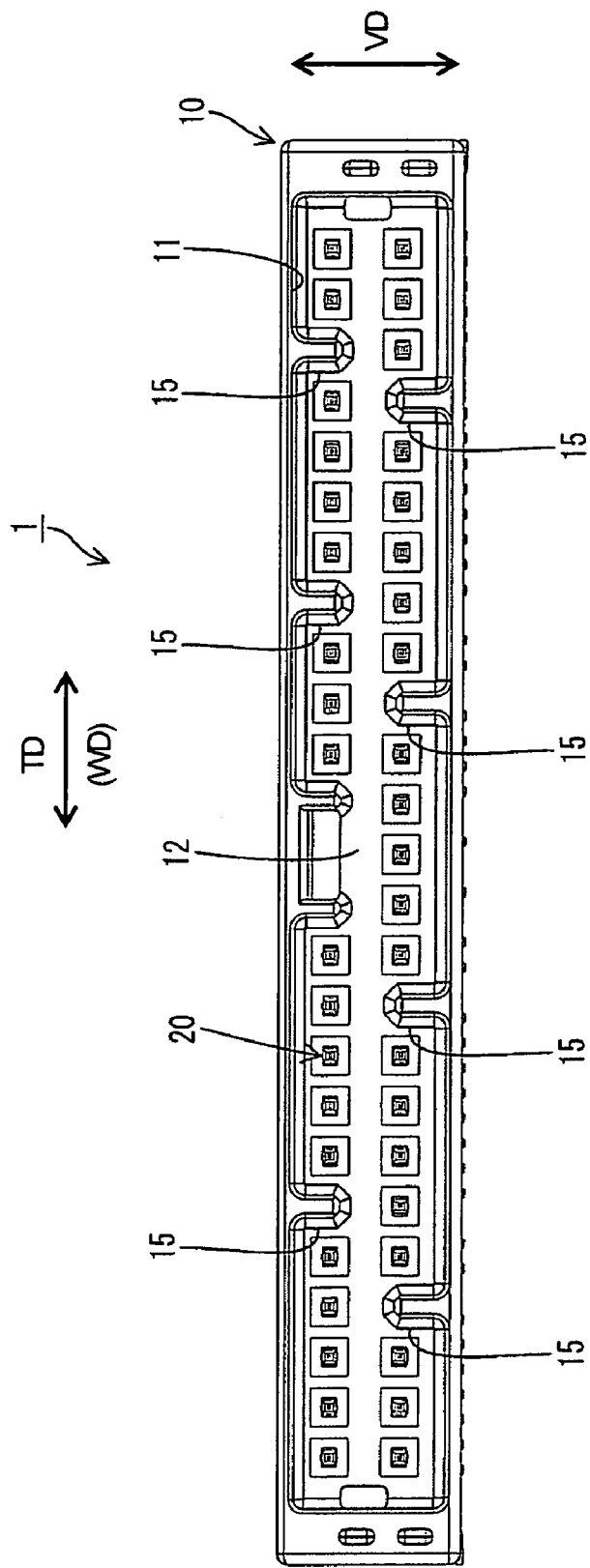
FIG. 3 is a front view of the connector.

A connector according to the invention is identified by the numeral 1 in FIGS. 1 to 4 and is intended to be mounted on an electric or electronic device, such as a circuit board B. The connector 1 has a housing 10 with opposite front and rear ends spaced from one another along forward and backward directions FBD. The housing 10 also has opposite sides that are spaced from one another along a width direction WD in FIGS. 1 and 3. The width direction WD is substantially normal to the forward and backward directions FBD. A transverse direction TD in FIG. 3 extends along the width direction WD of the housing 10. The vertical orientation in FIG. 3 defines a vertical direction VD, and an upper side in FIG. 3 is referred to as an upper side.

The housing 10 is made e.g. of a synthetic resin and has a receptacle 11 with an open front end, as shown in FIGS. 1 and 3. An unillustrated female connector can be fit in the receptacle 11 along a connecting direction CD that parallels the forward and backward directions FBD. Guides 15 project into the receptacle 11, as shown in FIG. 3, and extend along forward and backward directions FBD. The guides 15 engage with recesses in the female connector to permit connection only when the connectors are oriented properly and to guide the connectors during a connecting operation.

Tab-shaped male terminals 20 penetrate a back wall 12 of the receptacle 11 in forward and backward directions FBD. The male terminals 20 are made of a conductive material, such as a metal, and are arranged in the width direction WD at upper and lower stages. A front part of each male terminal 20 projects forward in the receptacle 11. A rear part of each male terminal 20 is narrower than the front part and extends back beyond the back wall 12 of the receptacle 11. A part of each male terminal 20 reward of the back wall 12 is bent down at a substantially right angle towards the circuit board B and a connecting portion 21 at the extreme rear end of the male terminal 20 is bent again at a substantially right angle to extend backward on the circuit board B. The connecting portions 21 are at substantially equal intervals on the circuit board B and extend along a substantially straight line in the width direction WD. Unillustrated lands are formed on the circuit board B at positions corresponding to the connecting portions 21 and can be fixed to the connecting portions 21 preferably by reflow soldering. Thus, the connecting portions 21 are connected electrically with the lands on the circuit board B.

As shown in FIG. 1, fixing members 30 are mounted on the opposite side surfaces of the housing 10 for fixing the connector 1 to the circuit board B preferably by reflow soldering. Each fixing member 30 is formed of a flat conductive metal plate that is bent into a substantially L-shape to define a mounting portion 31 and a bonding portion 32. The mounting portion 31 is to be mounted on the housing 10 and the bonding portion 32 to be soldered to the printed circuit board B. The opposite surfaces of the housing 10 include mounting surfaces 13 that can be brought into sliding contact with the mounting portions 31. Specifically, as shown in FIG. 1, bulges 35 bulge out in the forward and backward directions. FBD from the opposite edges of each mounting portion 31. On the other hand, slits 14 are formed along the vertical direction VD at positions of the housing 10 substantially corresponding to the bulges 35. The bulges 35 are insertable into the slits 14 from above and along a mounting direction MD and the bottom ends of the slits 14 are set so that further downward movement of the fixing member 30 in the mounting direction MD is prevented when the bonding portion 32 reaches the surface of the circuit board B. In this way, the fixing member 30 is held temporarily in the housing 10.

The mounting surfaces 13 are recessed substantially by the projecting distances of the bonding portions 32. Thus, as shown in FIG. 2, the opposite side surfaces of the housing 10 and the outer projecting edges of the bonding portions 32 are substantially flush when the fixing members 30 are mounted in the mounting portions 31. Unillustrated mounting portions (copper foils) are formed on the circuit board B at positions corresponding to the bonding portions 32, and solder is applied to the mounting portions. Thus, the bonding portions 32 can be soldered to the mounting portions on the circuit board B by reflow soldering.

As shown in FIG. 1, a step 31A projects out substantially perpendicularly from the bottom of the mounting portion 31 by a distance that is about half the thickness of the mounting portion 31. The mounting portions 31 of the fixing members 30 can be pushed by the housing 10 due to different thermal expansion between the housing 10 and the circuit board B if the circuit board connector 1 is installed in a high temperature atmosphere environment. However, the mounting portions 31 resiliently deform with the steps 31A as supports to take up the pressing forces, thereby significantly reducing the transmission of pressing forces to the bonding portions 32. As a result, the bonding portions 32 are kept fixed to the circuit board B without creating shear forces between the bonding portions 32 and the circuit board B, and the housing 10 will not detach from the circuit board B.

As shown in FIG. 1, slits 36 are formed in each bonding portion 32 at positions spaced apart in the forward and backward directions FBD to form projecting pieces 32A. The slits 36 extend from the projecting edge of the bonding portion 32 to positions near the step 31A and more than half of the extending distance of the bonding portion 32 in the width direction WD. A forward or backward force may act to turn the bonding portion 32 up. However, the force is divided at the slits 36 and part of the bonding portion 32 will remain secured to the circuit board B so that the housing 10 will not detach from the circuit board B.

A connecting piece 33 is formed substantially in the center of each projecting piece 32A. The connecting piece 33 is formed by a substantially U-shaped slit whose opening side faces towards the mounting portion 31. The area surrounded by the slit then is up. A clearance S is defined between the bottom edge of the leading end of the connecting piece 33 and the wall of a through hole 34. The connecting pieces 33 are bent at an angle so that the bottom edges of the leading ends thereof are above the upper surface of the bonding portion 32 in this embodiment. However, the bottom edges of the leading ends of the connecting pieces 33 may be below the upper surface of the bonding portion 32.

Figure 4:
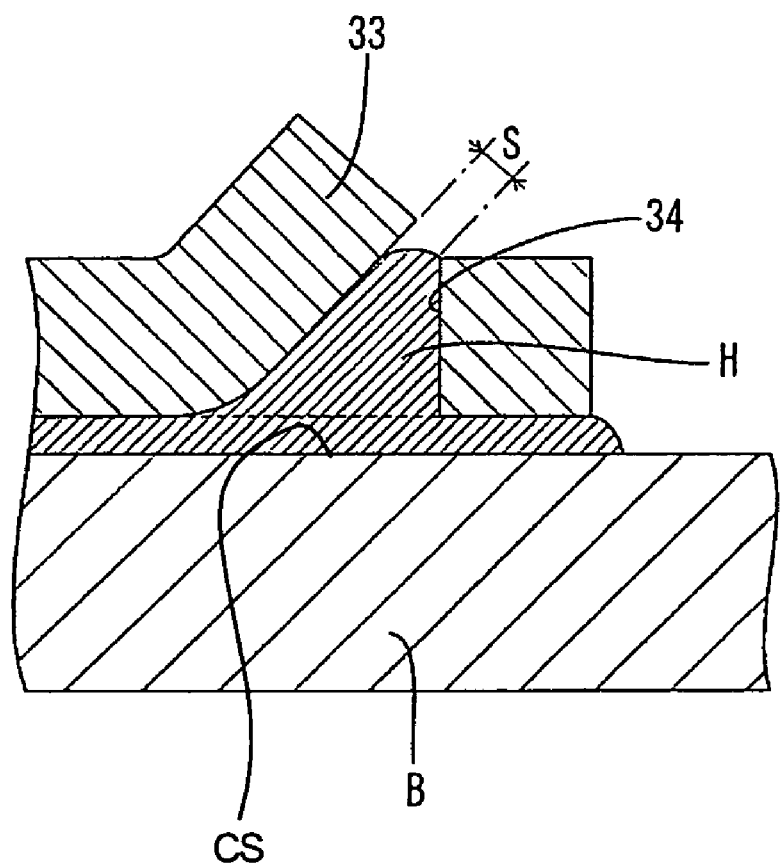
FIG. 4 is a section showing a state where solder is bonded to the lower surface of a connecting piece in a bonding portion.

The clearances S communicate with the through holes 34 formed by bending the connecting pieces 33. Thus, bubbles created in solder during reflow soldering can escape to the outside through the clearances S. Further, spaces are formed between the lower surfaces of the connecting pieces 33 and the inner surfaces of the through holes 34 in the bonding portion 32 for receiving molten solder H during reflow soldering, as shown in FIG. 4. The connecting piece 33 at least partly covers the through hole 34 at a surface substantially opposite a connecting surface CS on the circuit board B. Accordingly, the lower surfaces of the connecting pieces 33 and the inner surfaces of the through holes 34 can be soldered by solder H to maintain an effective bonding strength without significantly reducing a bonding area to a circuit board B.

The connector 1 is positioned on the circuit board B so that the connecting portions 21 of the male terminals 20 are on the unillustrated lands on the circuit board B and so that the bonding portions 32 of the fixing members 30 are on the unillustrated mounting portions on the circuit board B. The circuit board B having the connector 1 thereon then is passed through an unillustrated reflow furnace. The solder H is melted in the reflow furnace, and bubbles may be created in the molten solder H at the lower surfaces of the bonding portions 32. However, bubbles created in the solder H can escape to the outside through the clearances S that communicate with the through holes 34. Further, the molten solder H enters the through holes 34 in the reflow furnace so that the lower surfaces of the connecting pieces 33 and the inner surfaces of the through holes 34 are soldered, as shown in FIG. 4. The through holes 34 that let the bubbles escape do not decrease the bonding area to the circuit board B and hence do not reduce bonding strength. Therefore, bubbles created in the solder H are permitted to escape to the outside without reducing the bonding strength to the circuit board B.

As described above, the bonding strength to the circuit board B is high because the connecting pieces 33 are bonded to the solder H while defining the clearances S to let bubbles escape from the solder H. Further, the connecting pieces 33 are provided by cutting and bending parts of the bonding portion 32, and therefore are provided more easily than forming separate connecting pieces 33 that must be attached to the bonding portions 32 later.

The invention is not limited to the above described and illustrated embodiment. For example, the following embodiments are also embraced by the technical scope of the present invention as defined by the claims. Beside the following embodiments, various changes can be made without departing from the scope and spirit of the present invention as defined by the claims.

The connecting pieces are formed by cutting and bending the parts of the bonding portions in the foregoing embodiment. However, other configurations may be adopted provided that clearances S communicate with the through holes. For example, a connecting piece supported at both sides may be formed by forming two parallel slits and striking a part between the slits to project up from the bonding portion.

An edge section of each bonding portion may be folded up by 180° to cover part of the through holes from above.

Separate connecting pieces may be prepared and attached to the bonding portions later.

The fixing members are attached to the housing later in the foregoing embodiment. However, they may be formed integrally with the housing preferably by insert molding according to the invention.

Each bonding portion is formed with the slits to form projecting pieces in the foregoing embodiment. However, the slits may not be provided, and the bonding portion may be a single plate.

The invention is also applicable to connectors to be fixed to electric or electronic devices other than printed circuit boards such as junction boxes, dashboard panels, fuse boxes, relay boxes or the like.

What is claimed is:

1. A connector for an electric or electronic device (B), the connector having a housing (10) with at least one fixing member (30) for fixed connection to a connecting surface (CS) of the device (B), the fixing member (30) having at least one bonding portion (32) for bonding to solder (H), the bonding portion (32) being formed with at least one through hole (34), a connecting piece (33) at least partly covering the through hole (34) at a surface substantially opposite to the connecting surface (CS) of the device (B), the connecting piece (33) being bonded to the solder (H) while defining at least one clearance (S) that communicates with the through hole (34) for letting bubbles created in the solder (H) escape between the connecting piece (33) and the bonding portion (32) wherein the connecting piece is formed by cutting a part of the bonding portion and bending the cur part up at an acute angle to the bonding portion.

2. The connector of claim 1, wherein the fixing member (30) is to be fixed to the electric or electronic device (B) by reflow soldering.

3. The connector of claim 1, wherein the connecting piece (33) is formed by a substantially U-shaped slit with an opening side faced towards a mounting portion (31) of the fixing member (30).

4. The connector of claim 1, wherein the bonding portion (32) has slits (36) at positions spaced apart to define at least two projecting pieces (32A).

5. The connector of claim 4, wherein each projecting piece (32A) is soldered to the electric or electronic device (B).

6. The connector of claim 1, wherein at least one mounting surface (13) is provided on the housing (10) for sliding contact with at least one mounting portion (31) of the fixing member (30).

7. The connector of claim 6, wherein the mounting surfaces (13) are recessed inward by substantially the width of the bonding portions (32), so that the opposite side surfaces of the housing (10) and the outer edges of the bonding portions (32) are substantially flush with each other when the fixing members (30) is mounted in the mounting portions (31).

8. A connector comprising:
   a housing (10) with at least side surface;
   at least one fixing member (30) having a mounting portion (31) mounted to the side surface of the housing (10) and a bonding portion (32) extending angularly from the mounting portion (31) and away from the housing (10), the bonding portion (32) having a lower surface for soldered connection to a connecting surface (CS) of an electric or electronic device (B) by solder (H), at least one through hole (34) formed through the bonding portion (32) and having an inner peripheral edge, a connecting piece (33) cantilevered unitarily from the bonding portion (32) adjacent the through hole (34) and bent up at an acute angle to the bonding portion (32) sufficiently to define a clearance (S) between the connecting piece (33) and the inner peripheral edge of the through hole (34) for letting bubbles created in the solder (H) escape through the through hole (34) and the clearance (S), at least portions of a lower surface of the connecting piece (33) and the inner peripheral edge of the through hole (34) defining contact areas for the solder (H) for enhanced soldered connection.

9. The connector of claim 8, wherein the bonding portion (32) has at least one slit (36) to define at least two projecting pieces (32A), each of said projecting pieces (32A) being formed with a through hole (34) and a connecting piece (33).

10. The connector of claim 8, wherein the bonding portion (32) has at least two of said through holes (34) and at least two of said connecting pieces (33).

11. The connector of claim 8, wherein the bonding portion (32) is aligned substantially normal to the mounting portion (31).

12. The connector of claim 8, wherein the side surface of the housing (10) has a recessed mounting surface (13) for sliding contact with the mounting portion (31) of the fixing member (30).

13. The connector of claim 12, wherein the mounting surface (13) is recessed inward by substantially a projecting distance of the bonding portion (32), so that the opposite side surfaces of the housing (10) and the outer edges of the bonding portions (32) are substantially flush with each other when the fixing members (30) is mounted in the mounting portions (31).

14. The connector of claim 8, wherein the housing (10) has two opposite side surfaces and wherein the at least one fixing member (30) comprises two fixing members (30) mounted respectively to the side surfaces of the housing (10).

15. A fixing member (30) for mounting to an electric or electronic device (B), the fixing member (30) having a mounting portion (31) and a bonding portion (32) bent unitarily from and perpendicular to the mounting portion (31), the bonding portion (32) having a lower surface for soldered connection to a connecting surface (CS) of an electric or electronic device (B) by solder (H), at least one through hole (34) formed through the bonding portion (32) and having an inner peripheral edge, a connecting piece (33) cantilevered unitarily from the bonding portion (32) adjacent the through hole (34) and bent up at an acute angle to the bonding portion (32) sufficiently to define a clearance (S) between the connecting piece (33) and the inner peripheral edge of the through hole (34) for letting bubbles created in the solder (H) escape through the through hole (34) and the clearance (S), at least portions of a lower surface of the connecting piece (33) and the inner peripheral edge of the through hole (34) defining contact areas for the solder (H) for enhanced soldered connection.

16. The fixing member (30) of claim 15, wherein the bonding portion (32) has at least one slit (36) to define at least two projecting pieces (32A), each of said projecting pieces (32A) being formed with a through hole (34) and a connecting piece (33).

17. The fixing member (30) of claim 8, wherein the bonding portion (32) has at least two of said through holes (34) and at least two of said connecting pieces (33).

* * * * *